United States Patent [19]

Van Heelsbergen

[11] Patent Number: 5,483,159
[45] Date of Patent: Jan. 9, 1996

[54] QUADRATURE COIL SYSTEM FOR USE IN A MAGNETIC RESONANCE APPARATUS

[75] Inventor: Teunis R. Van Heelsbergen, Eindhoven, Netherlands

[73] Assignee: U.S. Philips Corporation, New York, N.Y.

[21] Appl. No.: 240,192

[22] Filed: May 9, 1994

Related U.S. Application Data

[63] Continuation of Ser. No. 33,701, Mar. 16, 1993, abandoned.

[30] Foreign Application Priority Data

Apr. 9, 1992 [EP] European Pat. Off. .............. 92201017

[51] Int. Cl.$^6$ ..................................................... G01R 33/28
[52] U.S. Cl. .......................................... 324/318; 324/322
[58] Field of Search ..................................... 324/300, 301, 324/309, 310, 311, 312, 313, 314, 318, 322; 128/653.5

[56] References Cited

U.S. PATENT DOCUMENTS

| | | | |
|---|---|---|---|
| 4,057,777 | 11/1977 | Merz et al. .............................. | 338/309 |
| 4,684,895 | 8/1987 | Misic ..................................... | 324/322 |
| 4,816,765 | 3/1989 | Boskamp ................................. | 324/318 |
| 4,879,516 | 11/1989 | Misic et al. ............................. | 324/318 |
| 4,918,388 | 4/1990 | Neil et al. ............................... | 324/322 |
| 4,928,064 | 5/1990 | Hanan ..................................... | 324/322 |
| 4,985,678 | 1/1991 | Ming et al. .............................. | 324/318 |
| 5,057,777 | 10/1991 | Kurczewski .............................. | 324/318 |
| 5,075,624 | 12/1991 | Bezjak ..................................... | 324/318 |
| 5,216,368 | 6/1993 | Leussler .................................. | 324/318 |
| 5,256,971 | 10/1993 | Boskamp ................................. | 324/318 |
| 5,280,248 | 1/1994 | Mastandrea et al. ..................... | 324/318 |

Primary Examiner—Sandra L. O'Shea
Assistant Examiner—Raymond Y. Mah
Attorney, Agent, or Firm—Laurie Gathman

[57] ABSTRACT

A quadrature coil system which includes the following elements. (1) First and second electric main conductors which are situated at a distance from one another in a first plane and a second plane, respectively, and each of which is formed as a loop with an opening, the main conductors having mainly the same orientation. (2) First and second connection conductors, each of which constitutes an electric connection between the free ends of the first and second main conductors, which free ends are situated to corresponding sides of the opening. (3) An electric connection device which is connected to the conductors so that first and second sets of turns are formed which are suitable to generate and/or receive first and second magnetic fields, respectively, which are mutually orthogonally directed. (a) There is provided at least one third connection conductor which constitutes an electric connection between a point on the first main conductor, being situated between the two free ends, and a corresponding point on the second main conductor; (b) each of the first and second connection conductors consist of substantially equal first and second connection conductor portions, the first connection conductor portions being connected to the free ends of the first main conductor and the second connection conductor portions being connected to the free ends of the second main conductor; (c) the four ends of the first and second connection portions are electrically connected, via an electric connection network, to one another and to the electric connection device.

16 Claims, 4 Drawing Sheets

QUADRATURE COIL SYSTEM FOR USE IN A MAGNETIC RESONANCE APPARATUS

This is a continuation of application Ser. No. 08/033,701, filed Mar. 16, 1993.

BACKGROUND OF THE INVENTION

The invention relates to a quadrature coil system for use in a magnetic resonance apparatus. The quadrature coil system includes first and second electric main conductors which are situated at a distance from one another in a first plane and a second plane, respectively, and each of which is formed as a loop with an opening. The main conductors having mainly the same orientation. The quadrature coil system further includes first and second connection conductors, each of which constitutes an electric connection between free ends, situated to corresponding sides of the opening, of the first and second main conductors. In addition, electric connection means are included which are connected to the conductors so that there are formed first and second sets of turns which are suitable to generate and/or receive first and second magnetic fields, respectively, which are mutually orthogonally directed.

An example of such a quadrature coil system is known from U.S. Pat. No. 5,057,777 which describes a quadrature coil system which is particularly suitable for examination of, for example the wrist of a patient by means of MRI (magnetic resonance imaging). The open ring represented by the path of each of the main conductors is shaped therein as a U. In the known quadrature coil system the conductors are connected to the connection means at oppositely situated ends of the coil system. The electric currents produced upon excitation at one side of the coil system then generate a horizontally directed RF magnetic field and the currents produced upon excitation at the other side produce a vertically directed RE magnetic field. It is a drawback of the known coil system that it must be connected to a transmitter or receiver at two remote points. Consequently, equalization currents will flow between the two connection points because these connection points are interconnected via interconnections outside the coil system the transmitter or receiver. These equalization currents cause undesirable interference fields whereby the image homogeneity and the signal-to-noise ratio could be affected, and also cause undesirable losses in the equalization path, which losses may also be detrimental to the signal-to-noise ratio. A known method of reducing this drawback, briefly indicated in the cited document, is the insertion of so-called RF traps in the connections whereby RF surface currents are blocked. It is a drawback, however, that these RF traps must be comparatively large so as to be effective. Moreover, it is necessary to shield these traps in order to prevent coupling to the environment, which would again give rise to disturbances. These shields themselves can also produce undesirable eddy currents which could disturb the RF field as well as the gradient field, thus affecting the image. Moreover, the traps require a time-consuming adjustment.

SUMMARY OF THE INVENTION

It is an object of the invention to provide a quadrature coil system of the kind set forth in which all connection means can be provided on the coil system in the immediate vicinity of one another. To achieve this, the coil system in accordance with the invention is characterized in that there is provided at least one third connection conductor which constitutes an electric connection between a point on the first main conductor, situated between the two free ends, and a corresponding point on the second main conductor. Each of the first and second connection conductors include substantially equal first and second connection conductor portions. The first connection conductor portions being connected to the free ends of the first main conductor and the second connection conductor portions being connected to the free ends of the second main conductor, the four free ends of the first and second connection conductor portions being electrically connected, via an electric connection network, to one another and to the electric connection means. All electric connection means are thus connected to the conductors via the connection network which is situated to one side of the coil system. When the coil system is arranged so that the first and second planes extend horizontally, the two main conductors form two horizontal turns which are capable of generating or receiving a vertically directed magnetic field. In conjunction with the connection conductors, portions of the main conductors then constitute vertical turns capable of generating or receiving a horizontally directed magnetic field. The values of the constituent components of the connection network can be chosen so that the resonant frequency of the turns is tuned to a predetermined value.

Because of the presence of the third connection conductor(s), one or more connections exist between the two horizontal turns. In order to prevent these connections from carrying a current, thus influencing the magnetic field generated by the horizontal turns, it is important that the connection points between this (these) third connection conductor(s) and the two main conductors carry the same potential. This is achieved in a very simple and elegant manner in an embodiment of the quadrature coil system in accordance with the invention which is characterized in that the connection network comprises mutually equal first capacitive elements which interconnect the free ends of the first connection conductor portions and the free ends of the second connection conductor portions, respectively, and also comprises mutually equal second capacitive elements which interconnect the free ends of connection conductor portions associated with the same connection conductor, the connection points of the third connection conductor(s) to the first and second main conductors being symmetrically situated relative to the openings. In this embodiment the currents in the two horizontal turns are equal, so that the points of the first and second main conductors, being connected to the same third connection conductor, carry the same potential. A further advantage of this embodiment resides in the fact that the vertical turns also carry the same current. As a result, the first capacitive elements do not carry a current for the horizontal turns and the second capacitive elements do not carry a current for the vertical turns. The horizontal and vertical modes of the coil system can thus be resonant independently of one another and be excited or sensed at a single position of the coil system. The number of third connection conductors may be odd (for example, one or three), so that there exists a central third connection conductor which is connected to the main conductors at points situated halfway the main conductors.

A preferred embodiment of the quadrature coil system in accordance with the invention is characterized in that each of the first capacitive elements comprises two mutually equal, series-connected first capacitors, the connection points of the series-connected first capacitors being interconnected via at least one second capacitor, each second capacitive element comprising a series connection of two first capacitors, associated with different first capacitive elements, and the second capacitor(s). The horizontal mode can then be excited or sensed via one of the first capacitors, and the vertical mode via the second capacitor(s).

In order to facilitate adjustment of the resonant frequency of the vertical turns without influencing that of the horizontal turns, a further version of the latter embodiment is characterized in that the ends of each of the first capacitive elements which are connected to portions of the same connection conductor are interconnected via mutually equal third capacitive elements.

A further version of the latter embodiment is characterized in that two mutually equal, series-connected second capacitors are provided, each of the third capacitive elements comprising two mutually equal, series-connected third capacitors, the connection points of the series-connected third capacitors being connected to the connection point of the second capacitors via mutually equal fourth capacitors.

For further simplification of the adjustment of the resonant frequency of the vertical turns, independently of that of the horizontal turns, a further embodiment of the device in accordance with the invention is characterized in that the central third connection conductor includes two portions which are situated one in the prolongation of the other, their free ends being interconnected via a circuit which includes a variable fifth capacitor.

The sensitivity (signal-to-noise ratio) of the vertical turns is additionally increased in an embodiment which is characterized in that the connection points of the central third connection conductor to the first and second main conductors are connected to the connection network via first and second additional conductors which are situated in the first and the second plane, respectively. In conjunction with the central third connection conductor, the additional conductors constitute an additional vertical turn. The connection of these additional conductors to the connection network can be readily realized in a version of this embodiment which is characterized in that the connection network comprises the following elements: for each of the first and second connection conductors a series connection of two mutually equal sixth capacitors which interconnects the free ends of the first and second connection conductor portions associated with the relevant connection conductor; a series connection of two mutually equal seventh capacitors which interconnects the free ends of the first and second additional conductors; two mutually equal eighth capacitors, each of which connects the connection point of one of the pairs of sixth capacitors to the connection point of the seventh capacitors.

When this version is used only as a receiver coil, it should be possible to uncouple this coil from the transmitter means during transmission. To this end, a further version is characterized in that a series connection of a coil and a switch is connected parallel to each sixth and seventh capacitor.

BRIEF DESCRIPTION OF THE DRAWINGS

These and other aspects of the invention will be described in detail hereinafter with reference to the drawing.

DETAILED DESCRIPTION OF THE PREFERRED EMBODIMENTS

Figure 1:
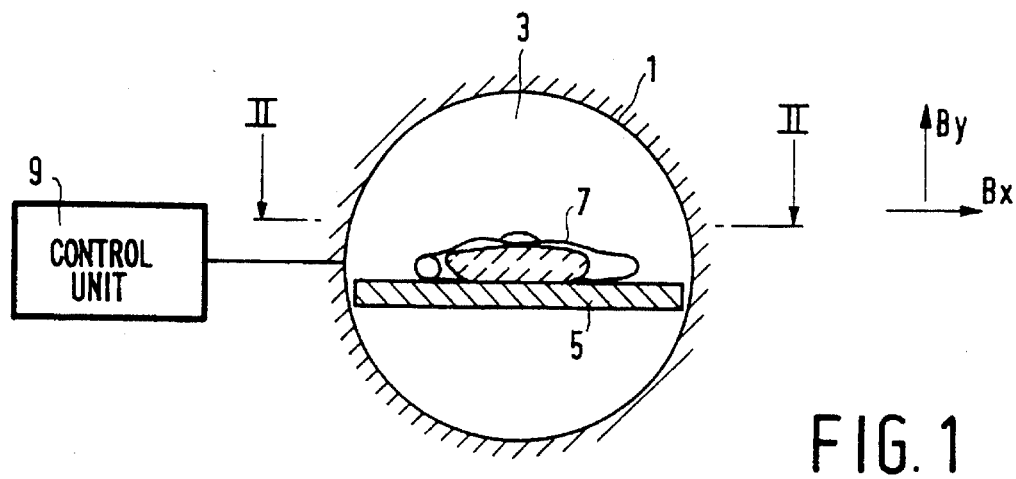
FIG. 1 is a diagrammatic cross-sectional view of an embodiment of a magnetic resonance apparatus.

The magnetic resonance apparatus which is only diagrammatically shown in FIG. 1 comprises a system 1 of body coils which are operative to generate a static, uniform magnetic field and gradient fields. Within the system there is formed a cylindrical cavity 3 for accommodating a patient 7 arranged on a table 5. There is also provided a power supply and control unit 9 which controls the apparatus so that selected parts of the patient 7 are imaged. To this end, a magnetic field is generated in known manner in the cavity 3, after which RF pulses are applied to given coils in the apparatus, RF magnetic fields thus generated being detected in order to obtain images of the selected parts. An apparatus of this kind is described in detail in, for example U.S. Pat. No. 4,816,765.

Figure 2:
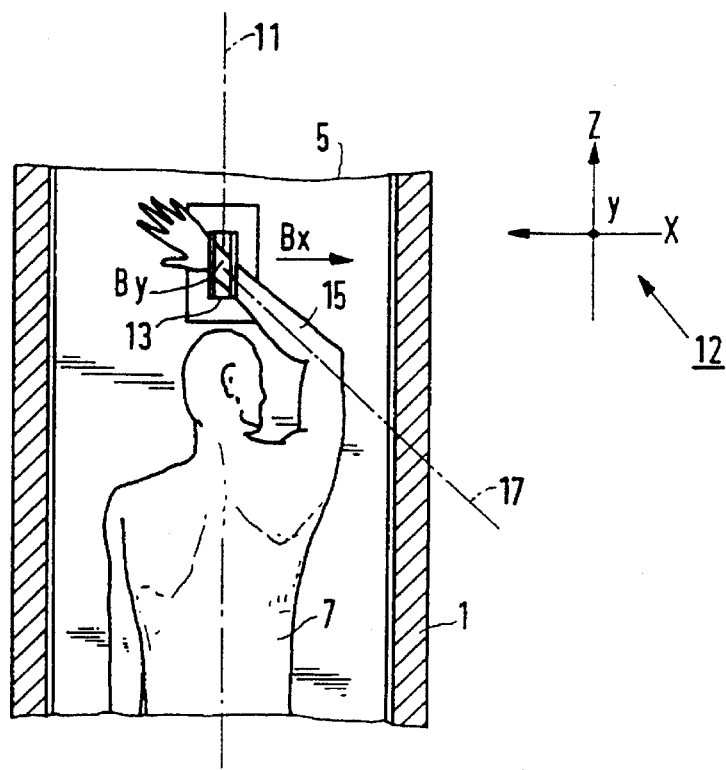
FIG. 2 is a longitudinal sectional view of a part of the apparatus shown in FIG. 1.

FIG. 2 is a sectional view of the apparatus, taken along the line II—II in FIG. 1. The patient 7 is positioned on the table 5 so that the longitudinal direction of the patient extends parallel to an axis 11 of the system. The axis 11 extends parallel to the main direction of the uniform magnetic field generated by the coil system 1. This direction, being a horizontal direction in the example shown, is denoted as the Z direction in the orthogonal system of coordinates 12 indicated in FIG. 2. The Y direction then extends vertically. In order to image the wrist of the patient 7, a quadrature coil system 13 in an embodiment of the invention is secured on the table 5 at the area of the isocentre, situated on the axis 11, of the magnetic field generated by the body coil system 1. FIG. 2 shows that the lower arm 15 of the patient 7 extends along an axis 17 which encloses an angle of approximately 45° relative to the axis 11. The patient is prone in a comfortable position, so that the patient can keep the wrist still during the examination. The wrist may rest on the edges of the quadrature coil system 13 as is also described in the cited document U.S. Pat. No. 5,057,777. The longitudinal direction of the wrist thus encloses an angle of approximately 45° relative to the X-Y plane of the coordinate system 12 in which the X and Y components $B_x$ and $B_y$, respectively, of an RF magnetic field to be generated or received by the quadrature coil system 13 are situated.

Figure 3:
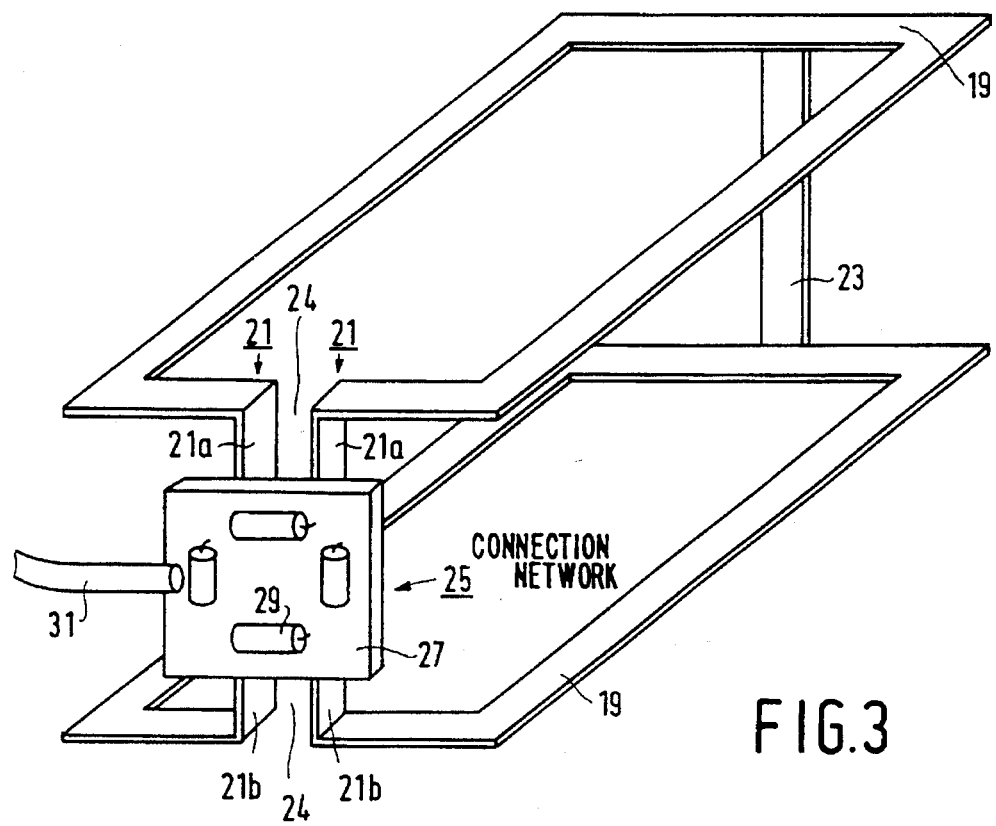
FIG. 3 is a perspective view of a first embodiment of a quadrature coil system in accordance with the invention which can be used in the apparatus shown in the FIGS. 1 and 2.

FIG. 3 is a perspective, diagrammatic view of a first embodiment of the quadrature coil system in accordance with the invention. The quadrature coil system shown comprises a number of electrically conductive portions which may be comprised of, for example, copper tubes, rods or strips. These portions may be provided on supports made of a suitable plastics as described in U.S. Pat. No. 5,057,777 or be constructed so as to be freely suspended as shown here. The portions comprise first and second main conductors 19, first and second connection conductors 21, and a third connection conductor 23. Each main conductor 19 is shaped as a loop having an opening 24. The first and second main conductors 19 are arranged at a distance from one another in a first plane and a second plane, respectively. These planes extend horizontally in FIG. 3, the first plane being situated over the second plane. The first and second main conductors have the same orientation, i.e. the openings 24 are situated to the same side, being the front side in FIG. 3. The first and second main conductors 19 are electrically interconnected by means of the third connection conductor 23 which extends substantially perpendicularly to the first and the second plane. In the present embodiment, the third connection conductor 23 is formed as a straight strip which interconnects the centers of the first and second main conductors 19.

The free ends of the first and second main conductors 19 which are situated to corresponding sides of the openings 24 are each time electrically interconnected by a first and a second connection conductor 21, respectively, the free ends situated to the left of the openings being interconnected by the first connection conductor. Each of the first and second connection conductors 21 includes substantially equal first and second connection conductor portions 21a, 21b which are situated one in the prolongation of the other and the free ends of which are interconnected via an electric connection network 25. The first connection conductor portions 21a are connected to the free ends of the first main conductor 19 and the second connection conductor portions 21b are connected to the free ends of the second main conductor. The connection network 25 comprises a printed circuit board 27 on which components 29 are provided. Electric connection means 31, for example in the form of connection wires bundled so as to form a cable, are also connected to the connection network 25. The connection network 25 thus connects the free ends of the connection conductor portions 21a, 21b to one another and to the connection means 31.

Figure 4:
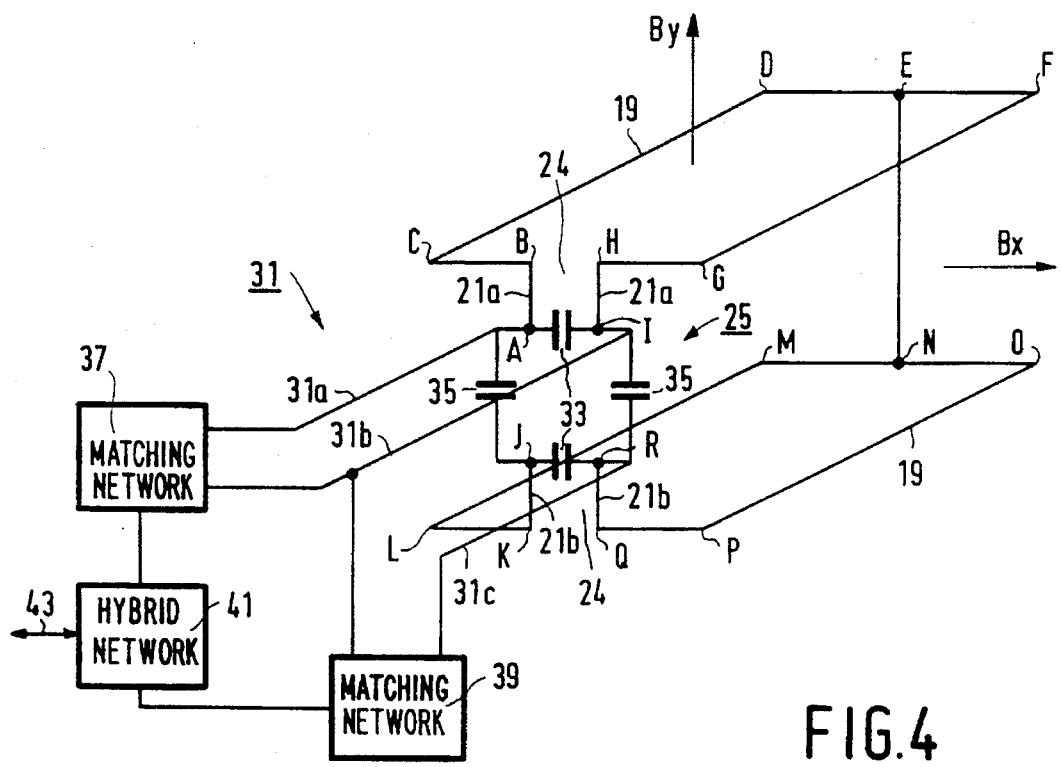
FIG. 4 is a diagrammatic view of the coil system shown in FIG. 3 with a first embodiment of a connection network and a part of a circuit connected thereto.

FIG. 4 shows diagrammatically the quadrature coil system of FIG. 3 with a first embodiment of the connection network 25 as well as a block diagram of a circuit connected thereto. In the present embodiment, the connection network 25 comprises two mutually equal first capacitive elements 33 and two mutually equal second capacitive elements 35. Each of these capacitive elements may be a single capacitor. One of the first capacitive elements 33 interconnects the free ends of the first connection conductor portions 2 la and the other capacitive element interconnects the free ends of the second connection conductor portions 2lb. Each second capacitive element 35 interconnects the free ends of the connection conductor portions 21a and 21b, respectively, associated with the same second connection conductor 21.

In the present embodiment the connection means 31 comprise three conductors 31a, 31b and 31c. The conductors 31a and 31b connect one of the first capacitive elements 33 to a first matching network 37 and the conductors 31b and 31c connect one of the second capacitive elements 35 to a second matching network 39. The matching networks 37, 39 are connected to a hybrid network 41 which is connected, via a connection 43, to a transmitter and/or a receiver (not shown). The matching networks 37 and 39 and the hybrid network constitute a known connection system for quadrature coil systems. Via the first matching network 37, a first RF current can be applied to the quadrature coil system, which first current follows a path mainly in the first main conductor 19 which is denoted by the points A, B, C, D, E, F, G, H, I in FIG. 1. Because a strong inductive coupling exists between the first and second main conductors 19, a similar RF current flows mainly through the second main conductor along the path I, K, L, M, N, O, P, Q, R. The two paths constitute a first RF coil system which includes two mainly horizontal turns. The currents flowing through these turns generate a vertically directed magnetic field $B_y$. Via the second matching network 39, a second RF current can be applied to the quadrature coil system, which second current exhibits a phase difference of 90° relative to the first RF current because of the presence of the hybrid network 41 but is otherwise equal thereto. The second RF current flows in the right-hand part of the quadrature coil system along the path I, H, G, F, E, N, O, P, Q, R and induces an RF current which flows along the path A, B, C, D, E, N, M, L, J in the left-hand part (which is strongly inductively coupled to the right-hand part). The latter two paths constitute a second RF coil system which includes two mainly vertical turns. The currents flowing through these turns generate a horizontally directed magnetic field $B_x$. Conversely, RF magnetic fields $B_x$ and $B_y$ produce currents according to the indicated paths in the two coil systems formed, which currents can be applied, via the matching networks 37 and 39 and the hybrid network 41, to a receiver device. The values of the capacitive elements 33 and 35 are chosen so that the horizontal and vertical turns are tuned to the frequency of the RF currents applied. The third connection conductor 23 is a common conductor of the two vertical turns. This conductor also interconnects the horizontal turns at the points E and N which are symmetrically situated relative to the openings 24. This means that the distances between the points E and N, respectively, on the one side and the free ends of the main conductor (the points B and H, and K and Q, respectively) on the other side are equal, measured along the relevant main conductor 19. As a result of the symmetrical construction of the described quadrature coil system and the equality of the capacitive elements 33, the points E and N carry the same potential for the horizontal turns. Therefore, the third connection conductor 23 does not carry a current of the horizontal turns. For the same reasons, the capacitive elements 35 do not carry a current of the horizontal turns. Because the capacitive elements 35 are also equal, the capacitive elements 33 do not carry a current of the vertical turns. The horizontal and vertical turns can thus operate independently of one another, even though they have a large part of their conductors in common. The horizontal and vertical modes can thus be resonant independently of one another and be excited or sensed at a single position of the quadrature coil system. Another advantage of the conductor positions shown resides in the fact that the accessibility of the coil system in the horizontal direction is maximum because only two connections at the center of the coil system intersect the horizontal plane.

Figure 5:
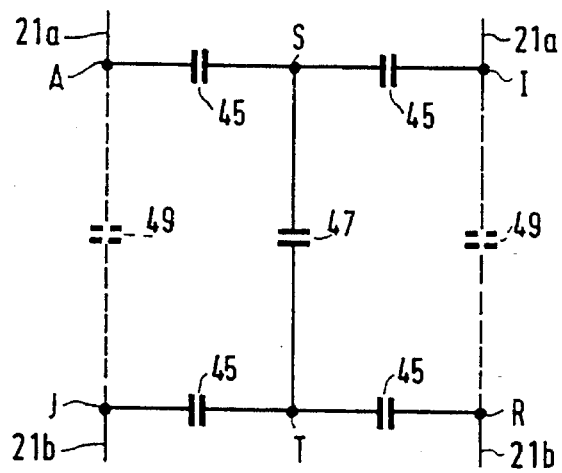
FIG. 5 shows an electric diagram of a second embodiment of a connection network.

FIG. 5 shows an electric diagram of a second embodiment of the connection network 25, each of the first capacitive elements, interconnecting the points A and I and J and R, respectively, being formed by two mutually equal, series-connected first capacitors 45. The connection points S and T of the series-connected first capacitors 45 are interconnected via a second capacitor 47. Each of the second capacitive elements, interconnecting the points A and J and I and R, respectively, then comprises a series connection of two first capacitors 45, associated with different first capacitive elements, and the second capacitor 47. For example, one of the second capacitor elements includes capacitor 45 between points A and S, capacitor 47 and capacitor 45 between points J and T. The other of the second capacitor elements is formed by capacitor 45 between points S and I, capacitor 47 and capacitor 45 between points T and R. The connection point U of one of the pairs of series-connected first capacitors 45 (for example, the point T) constitutes a common ground point for the horizontal and vertical modes. The horizontal mode, for example can be excited or sensed between the points J and T and the vertical mode between the points S and T. The value of the first capacitors 45 is chosen so that the horizontal turns are tuned to the selected frequency and the value of the second capacitor 47 is chosen so that the vertical turns are tuned to the selected frequency. If desired, for the tuning of the vertical turns two mutually equal third capacitive elements 49 (denoted by dashed lines) may be added to the second capacitive elements, the third capacitive elements interconnecting the ends of each of the first capacitive elements (the points A and J and the points I and R, respectively) connected to connection conductor portions of the first and the second connection conductor 21, respectively.

Figure 6:
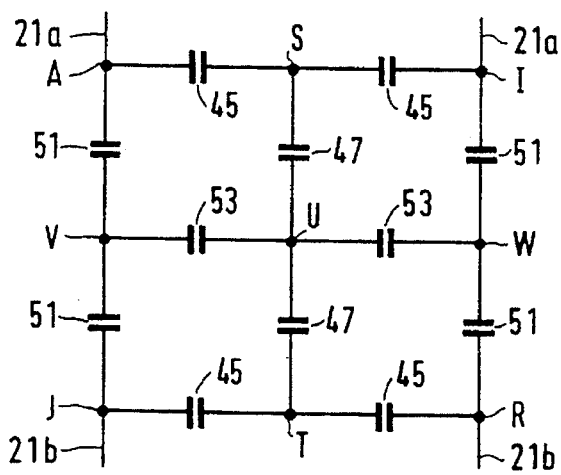
FIG. 6 shows an electric diagram of a third embodiment of a connection network.

FIG. 6 shows an electric diagram of a third embodiment of the connection network 25. In this embodiment the connection network 25 comprises first capacitors 45 which are connected to one another and to the points A, I, J and R in the same way as in the second embodiment, and also comprises a series connection of two mutually equal second capacitors 47 which takes the place of the single second capacitor 47 shown in FIG. 5. The connection point of the two second capacitors 47 is denoted by the letter U. Each third capacitive element 49 in this embodiment comprises two mutually equal, series-connected third capacitors 51 and the connection points V and W of the series-connected third capacitors are connected, via mutually equal fourth capacitors 53, to the connection point U of the second capacitors 47. In the present embodiment, the horizontal turns can be excited or sensed via one of the fourth capacitors 53 and the vertical turns via one of the second capacitors 47. The electric connection means 31 can thus be connected, for example to the points S, U and W.

Figure 7:
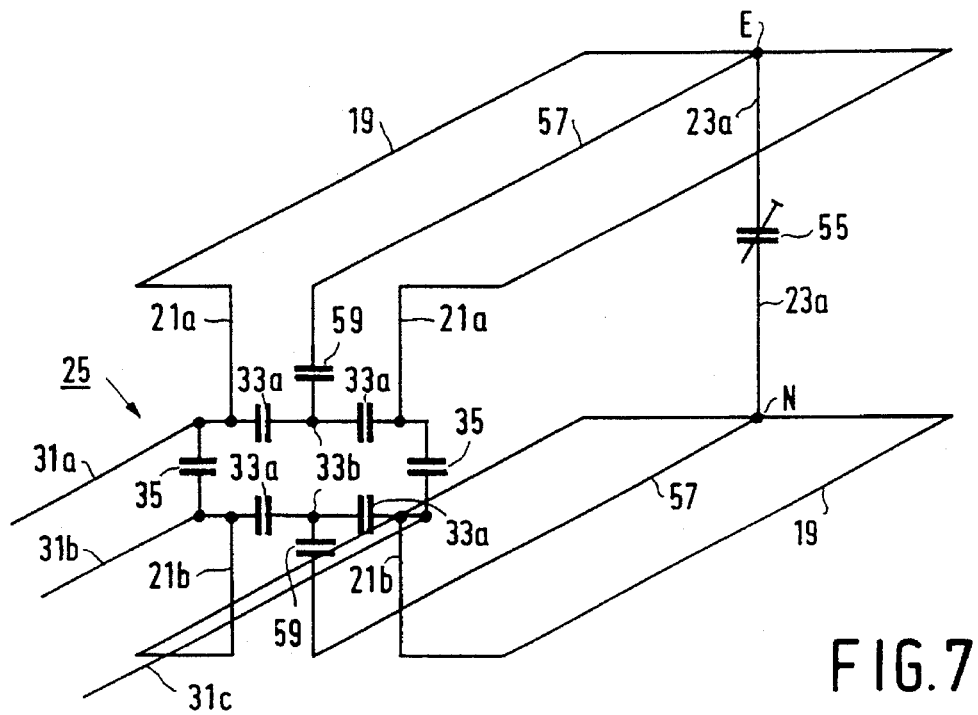
FIG. 7 is a diagrammatic view of a second embodiment of a quadrature coil system in accordance with the invention with a fourth embodiment of a connection network.

FIG. 7 is a diagrammatic perspective view of a second embodiment of the construction of the quadrature coil system in accordance with the invention which includes a fourth embodiment of the connection network 25. In the present embodiment the third connection conductor 23 includes two portions 23a which are situated one in the prolongation of the other and whose free ends are interconnected via a circuit which includes a variable fifth capacitor 55. In the present embodiment, the circuit includes a single capacitor 55 but may also be constructed, if desired, as a network which also includes other components. The variable capacitor 55 can be used to adjust the resonant frequency of the vertical turns without influencing the horizontal turns and without the matching via the matching networks 37 and 39 (see FIG. 4) being modified to any significant extent.

A further modification of the embodiment shown in FIG. 7 is where connection points E and N of the third connection conductor to the first and second main conductors 19 are connected to the connection network 25 via first and second additional conductors 57. The first of these additional conductors is situated in the first plane and the second is situated in the second plane. In conjunction with the third connection conductor 23, the additional conductors 57 constitute an additional vertical turn whereby the sensitivity (signal-to-noise ratio) of the horizontal mode is enhanced.

The connection of the additional conductors to the connection network 25 can be realized in various ways. The fourth embodiment of the connection network 25 shown in FIG. 7 is very similar to the embodiment shown in FIG. 4. However, in this case each first capacitive element 33 includes a series connection of two mutually equal capacitors 33a, the connection point 33b of which is connected, via a further capacitor 59, to the free end of one of the additional conductors 57. The further capacitors 59 are equal. The vertical turns can be excited or sensed, for example via one of the second capacitive elements 35, and the horizontal turns can be excited or sensed via one of the first capacitive elements 33.

Figure 8:
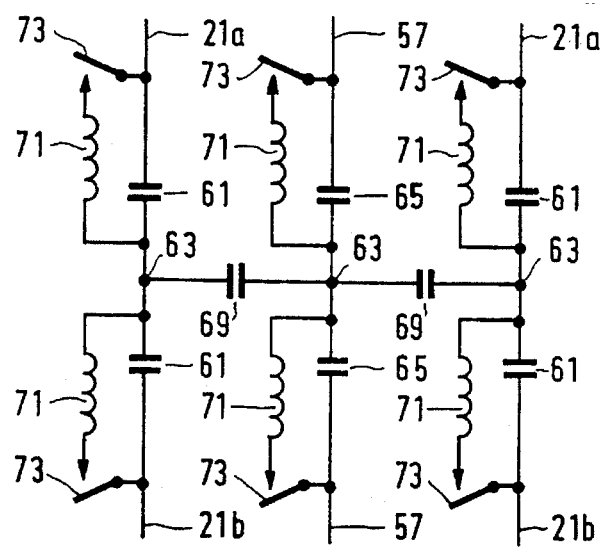
FIG. 8 shows an electric diagram of a fifth embodiment of a connection network.

FIG. 8 shows an electric diagram of a fifth embodiment of the connection network 25. In the present embodiment the connection network comprises, for each of the first and second connection conductors 21, a series connection of two mutually equal sixth capacitors 61 which interconnects the free ends of the connection conductor portions 21a and 21b associated with the relevant connection conductor. The connection point of each pair of series-connected sixth capacitors 61 is denoted by the reference numeral 63. The free ends of the first and second additional conductors 57 are interconnected via a series connection of two mutually equal seventh capacitors 65, the connection point of which is denoted by the reference numeral 67. The connection point 63 of one of the pairs of sixth capacitors 61 is connected to the respective connection point 67 of the seventh capacitors 65 via an eighth capacitor 69. The eighth capacitors 69 are mutually equal. The horizontal and vertical turns in this embodiment can be excited or sensed independently of one another via one of the eighth capacitors 69 and one of the seventh capacitors 65, respectively.

When the quadrature coil system is used exclusively as an RF receiver coil, it is desirable to uncouple the coil system from the transmitter during transmission. To this end, as is also shown in FIG. 8, a series connection of a coil 71 and a switch 73 may be provided parallel to each sixth and seventh capacitor 61, 65. During transmission, the switches 73 (preferably PIN diodes) are closed, so that the coils 71 constitute, in conjunction with the relevant capacitors 61, 65, rejection filters for the transmission frequency.

Figure 9:
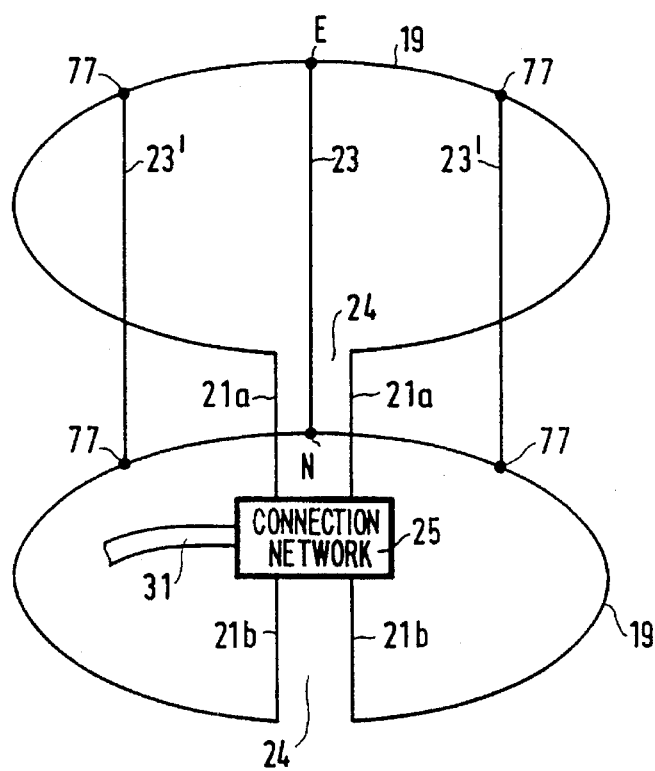
FIG. 9 is a diagrammatic view of a third embodiment of a quadrature coil system in accordance with the invention.

In the embodiment described with reference to FIG. 3 the first and second main conductors 19 are shaped as a rectangular loop. This shape is particularly suitable for examination of the wrist as shown in FIG. 2. For the examination of other parts of the body, other shapes are often more convenient. For example, for mammography a more or less circular quadrature coil system which is accessible from above is very suitable. An embodiment of a quadrature coil system in accordance with the invention having such a shape is diagrammatically shown in FIG. 9, corresponding components being denoted by the same references as used in the preceding Figures. In the present embodiment the main conductors 19 are shaped approximately as a circular loop having an opening 24. For mammography two of such coil systems can be used in an adjacent arrangement. The connection network 25 may be of a kind as described, for example with reference to the FIGS. 4 to 8. A further modification, which could also be used in the previously described embodiments, includes the addition of two additional third connection conductors which are denoted by the reference 23'. These additional third connection conductors can be used to influence the current distribution, and hence the shape of the magnetic field, in the horizontal mode, thus offering more possibilities for the design of the quadrature coil system. The number of additional third connection conductors, evidently, may also be greater than two, but is preferably even so that the total number, including the central third connection conductor 23, is odd. The connection points E, N, 77 of the third connection conductors 23, 23' to the first and second main conductors 19 are preferably symmetrically situated relative to the openings 24. This means that the central third connection conductor 23 is connected to the main conductors 19 at points E and N which are situated halfway these main conductors, the remaining third connection conductors 23' being connected to the main conductors at points 77 which are pair-wise symmetrically situated relative to the points E and N. It will be evident that additional third connection conductors 23' can also be used in the previously described embodiments.

Evidently, various alternatives are feasible for the described embodiments. For example, the variable fifth capacitor 55 included in the third connection conductor 23 can also be used in the embodiments described with reference to the FIGS. 3 to 6 and 9. The same holds for the additional conductors 57. In addition to capacitors, if desired, the connection network 25 may also comprise other components, for example coils. The quadrature coil system in accordance with the invention can be successfully used in various magnetic resonance apparatus which are known per se.

I claim:

1. A quadrature coil system for use in a magnetic resonance apparatus, comprising:

first and second electric main conductors situated at a distance from one another in a first plane and a second plane, respectively, and each of which is formed as a loop with an opening having free ends at the sides of each of the openings, said main conductors having mainly the same orientation;

first and second connection conductors, each of which constitutes an electric connection between the corresponding free ends of the main conductors, situated at corresponding sides of the opening, of the first and second main conductors;

electric connection means connected to said first and second main conductors so that there are formed first and second sets of turns which are suitable to generate and receive first and second magnetic fields, respectively, which are mutually orthogonally directed, characterized in that there is provided at least one third connection conductor which constitutes an electric connection between a first connection point on the first main conductor, situated between the two free ends, and a second connection point on the second main conductor, each of the firsthand second connection conductors being comprised of substantially equal first and second connection conductor portions, the first connection conductor portions being connected to the free ends of the first main conductor and the second connection conductor portions being connected to the free ends of the second main conductor, the four free ends of the first and second connection conductor portions being electrically connected, via an electric connection network, to one another and to the electric connection means.

2. A quadrature coil system as claimed in claim 1, characterized in that the connection network comprises mutually equal first capacitive elements which interconnect the free ends of the first connection conductor portions and the free ends of the second connection conductor portions, respectively, and also comprises mutually equal second capacitive elements which interconnect the free ends of connection conductor portions associated with the same connection conductor, the connection points of the third connection conductor(s) to the first and second main conductors being symmetrically situated relative to the openings.

3. A quadrature coil system as claimed in claim 2, further including a plurality of third connection conductors such that the number of third connection conductors is odd, a central third connection conductor of said third connection conductors being connected to the main conductors at halfway points of the main conductors.

4. A quadrature coil system as claimed in claim 2, characterized in that each of the first capacitive elements comprises two mutually equal, series-connected first capacitors connected together at a first connection point and further including a second capacitor for interconnecting the first connection points of the series-connected first capacitors one of the second capacitive elements being formed by (i) one of the first capacitors of one of the first capacitive elements, (ii) the second capacitor, and (iii) one of the first capacitors of the other first capacitive element, and the other second capacitive element being formed by (i) the other of the first capacitors of one of the first capacitive elements, (ii) the second capacitor, and (iii) the other of the first capacitors of the other first capacitive element.

5. A quadrature coil system as claimed in claim 4, further including mutually equal third capacitive elements for coupling the ends of each of the first capacitive elements, which are connected to the first and second connection conductor portions of the same connection conductor, together.

6. A quadrature coil system as claimed in claim 5, further including two mutually equal, series-connected second capacitors connected together at a central connection point, and mutually equal fourth capacitors, each of the third capacitive elements comprising two mutually equal, series-connected third capacitors connected together at a second connection point, the second connection points of the series-connected third capacitors being connected to the central connection point of the second capacitors via the mutually equal fourth capacitors.

7. A quadrature coil system as claimed in claim 3, further including a variable connection conductor capacitor and wherein the third connection conductor includes two portions situated one in the prolongation of the other, and coupled together by the variable connection conductor capacitor at the free ends of the two portions.

8. A quadrature coil system as claimed in claim 3, further including first and second additional conductors which are situated in the first and the second plane, respectively, wherein the first and second connection points of the central third connection conductor to the first and second main conductors are connected to the connection network via the first and second additional conductors.

9. A quadrature coil system as claimed in claim 8, characterized in that the connection network comprises the following elements:

for each of the first and second connection conductors a series connection of two further mutually equal capacitors connected together at a third capacitor connection point and which interconnects the free ends of the first and second connection conductor portions associated with the relevant connection conductor;

a series connection of two additional mutually equal capacitors connected together at a fourth capacitor connection point which interconnects the free ends of the first and second additional conductors;

two mutually equal other capacitors, each of which connects the third capacitor connection point of one of the pairs of further mutually equal capacitors to the fourth capacitor connection point of the two additional mutually equal capacitors.

10. A quadrature coil system as claimed in claim 9, further including a series connection of a coil and a switch which are connected in parallel to each further and additional capacitor.

11. The quadrature coil system as claimed in claim 1, in combination with a magnetic resonance apparatus, wherein said system is included within the magnetic resonance apparatus.

12. A quadrature coil system for use in a magnetic resonance apparatus, comprising:

a first main conductor formed in a loop oriented in a first plane and having free ends forming an opening;

a second main conductor formed in a loop oriented in a second plane substantially parallel to said first plane and having free ends forming an opening, said openings defined by said free ends being oriented adjacent to one another;

connection conductors each coupled to said main conductors such that one connection conductor is coupled at each edge of said main conductors for coupling the corresponding edges of the first main conductor to the corresponding edges of the second main conductor;

a third connection conductor for coupling said first main conductor to said second main conductor at a point on each loop which point defines, with an associated edge, a first portion and a second portion of each main conductor;

an electric connection network coupled to receive electric connection means and coupled to said connection conductors for forming from said first and second main conductors a first set of turns which receive and generate a first magnetic field substantially orthogonal to said first and second planes, such that during generation of said first magnetic field current flows through the first and second portions of the first main conductor and generates a current through the first and second portions of the second main conductor, but current does not flow through the third connection conductor as a result of the first magnetic field, and such that a second set of turns are formed by the first portions of the main conductors and the third connection conductor and the second portions of the main conductors and the third connection conductor which second set of turns receive and generate a second magnetic field orthogonal to said first magnetic field, such that current flows through the first portion of the first main conductor, the third connection conductor and the first portion of the second main conductor and generates current in the second portion of the first main conductor, the third connection conductor and the second portion of the second main conductor.

13. The quadrature coil system as claimed in claim 11, further includes a plurality of third connection conductors such that said plurality is an odd number of third connection conductors.

14. A quadrature coil system for use in a magnetic resonance apparatus, comprising:

a first main conductor formed in a loop oriented in a first plane and having an opening at its free ends;

a second main conductor formed in a loop oriented in a second plane substantially parallel to said first plane and having an opening defined by its free ends, such that the first and second main conductors form two turns one in each plane capable of receiving and generating a first magnetic field and said openings being oriented adjacent to one another;

a third connection conductor coupling, at connection points, said first main conductor to said second main conductor such that each of said first main conductor and said second main conductor includes two portions where corresponding portions of said first main conductor and said second main conductor form a second set of turns with the third connection conductor which second set of turns receive and generate a second magnetic field orthogonal to said first magnetic field;

connection conductors each having first connection conductor portions coupled to a respective free end of the first main conductor and each first connection conductor portion having its own respective free end and each connector conductor having second connection conductor portions coupled to a respective free end of the second main conductor and each second connection conductor portion having its own respective free end;

an electric connection network for coupling the free ends of the first and second connection conductor portions to one another and for connection to electric connection means; and wherein the electric potential of the connection points of the third connection conductor are equal while there is no second magnetic field and during the generation of the first magnetic field.

15. The quadrature coil system as claimed in claim 14, wherein the electric connection network includes mutually equal first capacitive elements, one first capacitive element for coupling the free ends of the first connection conductor portions together, and the other first capacitive element for coupling the free ends of the second connection conductor portions together; and two mutually equal second capacitive elements, one for coupling one of the free end of the first connection conductor portion to the corresponding free end of the second connection conductor portion of the same connection conductor, the other second capacitive element for coupling the free ends of the other of the first connection conductor portion to the free end of the other of the second connection conductor portion.

16. The quadrature coil system as claimed in claim 15, wherein the connection points of the third connection conductor to the first and second main conductors define first and second portions of said main conductor portion and wherein the respective first portions of each of the main conductors are equal.

* * * * *